(12) United States Patent
Tiron et al.

(10) Patent No.: US 10,923,352 B2
(45) Date of Patent: Feb. 16, 2021

(54) METHOD FOR FORMING A FUNCTIONALISED GUIDE PATTERN FOR A GRAPHOEPITAXY METHOD

(71) Applicant: COMMISSARIAT A L'ENERGIE ATOMIQUE ET AUX ENERGIES ALTERNATIVES, Paris (FR)

(72) Inventors: Raluca Tiron, Saint-Martin-le-Vinoux (FR); Nicolas Posseme, Sassenage (FR); Xavier Chevalier, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 262 days.

(21) Appl. No.: 16/304,969

(22) PCT Filed: May 23, 2017

(86) PCT No.: PCT/EP2017/062452
§ 371 (c)(1),
(2) Date: Nov. 27, 2018

(87) PCT Pub. No.: WO2017/202859
PCT Pub. Date: Nov. 30, 2017

(65) Prior Publication Data
US 2020/0335327 A1    Oct. 22, 2020

(30) Foreign Application Priority Data
May 27, 2016   (FR) ...................................... 16 54790

(51) Int. Cl.
*H01L 21/027*   (2006.01)
*H01L 21/02*    (2006.01)
(Continued)

(52) U.S. Cl.
CPC ...... *H01L 21/0271* (2013.01); *H01L 21/0217* (2013.01); *H01L 21/02118* (2013.01);
(Continued)

(58) Field of Classification Search
None
See application file for complete search history.

(56) References Cited

U.S. PATENT DOCUMENTS

| 4,379,001 A | 4/1983 | Sakai et al. |
| 8,853,085 B1 | 10/2014 | Abdallah et al. |

(Continued)

FOREIGN PATENT DOCUMENTS

| EP | 2 276 690 A2 | 1/2011 |
| FR | 2 975 823 A1 | 11/2012 |

(Continued)

OTHER PUBLICATIONS

International Search Report as issued in International Patent Application No. PCT/EP2017/062452, dated Aug. 24, 2017.
(Continued)

*Primary Examiner* — Alexander G Ghyka
(74) *Attorney, Agent, or Firm* — Pillsbury Winthrop Shaw Pittman LLP (57) ABSTRACT

A method for forming a functionalised guide pattern, includes forming a functionalisation layer on a substrate; depositing a protective layer on the functionalisation layer; forming a guide pattern on the protective layer that has a cavity opening onto the protective layer and a bottom and side walls; implanting ions with an atomic number of less than 10 in a portion of the protective layer located at the bottom of the cavity, such that the implanted portion can be selectively etched relative to the non-implanted portion; forming, in the cavity, a second functionalisation layer having first and second portions disposed on, respectively, (Continued)

the protective layer at the bottom of the cavity and the side walls of the cavity; and selectively etching the implanted portion and the first portion of the second functionalisation layer, to expose a portion of the functionalisation layer located at the bottom of the cavity.

20 Claims, 2 Drawing Sheets

(51) Int. Cl.
    *H01L 21/3115*     (2006.01)
    *H01L 21/311*     (2006.01)
    *H01L 21/3105*     (2006.01)

(52) U.S. Cl.
    CPC .. *H01L 21/31058* (2013.01); *H01L 21/31133* (2013.01); *H01L 21/31138* (2013.01); *H01L 21/31155* (2013.01)

(56) References Cited

U.S. PATENT DOCUMENTS

| | | | |
|---|---|---|---|
| 10,795,257 B2* | 10/2020 | Tiron | G03F 7/0048 |
| 2014/0256145 A1* | 9/2014 | Abdallah | H01L 21/0271 438/703 |
| 2015/0076108 A1 | 3/2015 | Chang | |
| 2015/0249112 A1 | 9/2015 | Takeguchi et al. | |
| 2016/0077264 A1 | 3/2016 | Kang et al. | |
| 2017/0219922 A1* | 8/2017 | Ku | C08F 220/10 |
| 2017/0307973 A1* | 10/2017 | Navarro | C09D 153/00 |
| 2019/0080958 A1* | 3/2019 | Chi | H01L 21/76897 |
| 2019/0267233 A1* | 8/2019 | Claveau | H01L 21/31055 |
| 2019/0278170 A1* | 9/2019 | Tiron | H01L 21/31144 |
| 2019/0278172 A1* | 9/2019 | Lee | H01L 21/0337 |
| 2019/0363008 A1* | 11/2019 | Gstrein | H01L 23/5283 |
| 2020/0066509 A1* | 2/2020 | Somervell | G03F 7/423 |
| 2020/0294796 A1* | 9/2020 | Azuma | H01L 21/0271 |

FOREIGN PATENT DOCUMENTS

| | | |
|---|---|---|
| FR | 3 000 600 A1 | 7/2014 |
| FR | 3 000 601 A1 | 7/2014 |
| FR | 3 025 937 A1 | 3/2016 |
| FR | 3 037 715 A1 | 12/2016 |
| FR | 3 041 471 A1 | 3/2017 |
| WO | WO 2009/134635 A2 | 11/2009 |
| WO | WO 2014/102222 A1 | 7/2014 |

OTHER PUBLICATIONS

Tiron, R., et al., "Template affinity role in CH shrink by DSA planarization," Optomechatronic Micro/Nano Devices and Components III, Oct. 2007, Proc. of SPIE, vol. 9423, Mar. 2015, XP060051606, pp. 942317-1-942317-11.

Cheng, J., et al., "Customization and Design of Directed Self-Assembly Using Hybrid Prepatterns," Optomechatronic Micro/Nano Devices and Components III, Oct. 2007, Proc. of SPIE, vol. 9423, Mar. 2015, XP060051623, pp. 942307-1-942307-8.

Liu, C.-C., et al., "Fin formation using Graphoepitaxy DSA for FinFET device fabrication," Optomechatronic Micro/Nano Devices and Components III, Oct. 2007, Proc. of SPIE, vol. 9423, Mar. 2015, XP060051595, pp. 94230S-1-94230S-10.

Choi, J. W., et al., "A facile route for fabricating graphene nanoribbon array transistors using graphoepitaxy of a symmetric block copolymer," Optomechatronic Micro/Nano Devices and Components III, Oct. 2007, Proc. of SPIE, vol. 9428, Mar. 2015, XP060051918, pp. 94280T-1-94280T-10.

Chevalier, X., et al., "Study and optimization of the parameters governing the block copolymer self-assembly: toward a future integration in lithographic process," Proc. SPIE 7970, Alternative Lithographic Technologies III, 79700Q, Apr. 2011, 11 pages.

* cited by examiner

METHOD FOR FORMING A FUNCTIONALISED GUIDE PATTERN FOR A GRAPHOEPITAXY METHOD

CROSS REFERENCE TO RELATED APPLICATIONS

This application is the U.S. National Stage of PCT/EP2017/062452, filed May 23, 2017, which in turn claims priority to French Patent Application No. 1654790 filed May 27, 2016, the entire contents of all applications are incorporated herein by reference in their entireties.

TECHNICAL FIELD

The present invention relates to a method for forming a functionalised guide pattern intended for a graphoepitaxy method. The present invention also relates to a graphoepitaxy method using a functionalised guide pattern obtained by such a method.

PRIOR ART

The need for methods making it possible to produce objects having ever smaller dimensions is constantly increasing, and this is so on account of the trend towards miniaturisation of electronic components.

Among the most promising alternative lithography techniques may be cited lithography techniques using self-assembly of block copolymers.

A block copolymer is a polymer composed of several blocks of monomers, for example two blocks of monomers A and B, of different chemical natures, bound together by a covalent bond. When sufficient mobility is given to the chains, for example by heating, the chain A and the chain B have a tendency to phase separate and reorganise to form perfectly organised structures, such as for example a two-dimensional network comprising spheres of A in a matrix of B, or cylinders of A in a matrix of B, or instead intercalated lamella of A and lamella of B.

Block copolymers thus have the property of forming patterns that may be controlled thanks to the ratio of monomers. Moreover, the periodicity of the patterns formed by the block copolymers is directly linked to the molar mass of the block copolymers, such that by controlling this molar mass it is possible to control the resolution of the patterns that they form.

These properties of block copolymers are used within the scope of graphoepitaxy methods. Graphoepitaxy methods generally consist in producing guide patterns on the surface of a substrate, these guide patterns defining cavities within which the block copolymers are going to be deposited to form secondary patterns of better resolution.

However, it is difficult to control the orientation of the secondary patterns with respect to the guide patterns.

Indeed, the orientation of the secondary patterns with respect to the guide patterns depends on the interactions of the monomer blocks of the block copolymer with the surfaces of the guide pattern, with those of the substrate and with air.

If the guide has the same preferential affinity with one of the two phases of the block copolymer at the bottom and on the walls of the guiding cavity, then this phase is going to self-organise at the interface with the guide. Thus the domain that has to be removed preferentially during the revelation step will not traverse the full height of the guide pattern and a residual layer of the other phase of the polymer is going to form at the interface with the substrate. This will be a limitation for the transfer by etching of the block copolymers thereafter.

The most advantageous case is to generate guide patterns having a neutral cavity bottom (equivalent interaction of the two blocks with the substrate) and with the edges of the cavity preferentially affined with one of the two phases of the polymer. In this case the domain of the sacrificial polymer that is going to be removed selectively during the revelation step traverses the entire thickness up to the interface with the substrate, which is very advantageous for the step of transferring the patterns in the substrate by etching (ref. R. Tiron et al, SPIE 2015).

Furthermore, in the case of an A-b-B type block copolymer the control of the interaction energies with the surface may take place for example by grafting A-r-B type random copolymers of judiciously chosen composition (ref. X. Chevalier et al, SPIE 2011).

Methods of the prior art have proposed controlling these interactions by grafting a random polymer to the bottom of the cavity whereas the walls of the cavity remain bare. To do this, the random polymer is diluted then it is deposited by spin coating. During the grafting annealing, a low thickness of the random polymer then fixes itself onto the bottom of the cavity whereas the walls of the cavity remain bare. However, when on the same silicon substrate there are guide patterns with variable densities, even if the method functions for a given pattern, this technique does not work for guides with a higher density because the layer of random polymer is also deposited on the walls of the cavity.

DESCRIPTION OF THE INVENTION

The invention aims to overcome the drawbacks of the prior art by proposing a method making it possible to form a guide pattern for graphoepitaxy wherein the bottom and the walls of the cavities of the guide pattern are functionalised differently, whatever the density of the guide pattern.

To do this, according to a first aspect of the invention, a method is proposed for forming a functionalised guide pattern intended for the self-assembly of a block copolymer by graphoepitaxy, this forming method comprising the following steps:

forming on a substrate a first functionalisation layer made of a first material having a first chemical affinity with respect to the block copolymer;

depositing a protective layer on the first functionalisation layer;

forming a guide pattern on the protective layer, the guide pattern comprising at least one cavity opening onto the protective layer, the cavity comprising a bottom and side walls;

implanting ions having an atomic number less than 10 in a portion of the protective layer located at the bottom of the cavity by exposure to an ion bombardment, in such a way that the implanted portion of the protective layer can be selectively etched with respect to the non-implanted portion of the protective layer;

forming, in the cavity, a second functionalisation layer made of a second material having a second chemical affinity with respect to the block copolymer, the second functionalisation layer comprising a first portion arranged on the protective layer at the bottom of the cavity and a second portion arranged on the side walls of the cavity; and etching the implanted portion of the protective layer and the first portion of the second functionalisation layer selectively with respect to the non-implanted portion of the protective layer, the second portion of the second functionalisation layer and the first functionalisation layer, so as to expose a portion of the first functionalisation layer located at the bottom of the cavity.

The method thus makes it possible to form a guide pattern comprising at least one cavity of which the bottom is functionalised with a first functionalisation layer and of which the side walls are functionalised with a second functionalisation layer. This method is efficient whatever the density of the cavities in the guide pattern.

The first and second functionalisation layers make it possible to control the affinity of the block copolymer that will be deposited in the cavity with respectively the bottom and the side walls of the cavity.

The method is particularly advantageous because the protective layer makes it possible to protect the first functionalisation layer from the later steps of the method. The guide pattern is next formed on the protective layer. The guide pattern defines at least one cavity in which the block copolymer will be deposited. Moreover, the cavity is a through cavity such that a portion of the protective layer is exposed. The guide pattern thus also serves as mask through which this portion of the protective layer is going to be modified so as to be able to be selectively etched with respect to the remainder of the protective layer, and with respect to the substrate and to the guide pattern. During the step of modifying the portion of the protective layer to be etched, light ions are implanted in the portion exposed to the ion bombardment.

Moreover, the protective layer makes it possible not to graft the second functionalisation layer instead of the first functionalisation layer during the formation of the second functionalisation layer by avoiding that the two functionalisation layers are in contact.

The first portion of the second functionalisation layer is eliminated during the step of selectively etching the implanted portion of the protective layer. Conversely, during this step, the second portion of the second functionalisation layer is not etched.

The method according to the first aspect of the invention may also have one or more of the following characteristics taken individually or according to all technically possible combinations thereof.

According to different embodiments:
the step of forming the second functionalisation layer may take place after the ion implantation step; or then
the step of forming the second functionalisation layer may take place before the ion implantation step.

Advantageously, the step of forming the first functionalisation layer comprises the following sub-steps:
depositing a layer of a first polymer, preferably by spin coating;
grafting the layer of the first polymer on the substrate, preferably by thermal annealing or photo-crosslinking;
rinsing using a solvent.

Advantageously, the step of forming the guide pattern comprises the following sub-steps:
depositing at least one base layer on the protective layer;
etching the base layer by lithography.

More specifically, the step of forming the guide pattern may comprise the following sub-steps:
depositing a SOC (spin on carbon) layer on the protective layer;
crosslinking annealing;
depositing a SiARC (silicon containing anti-reflective coating) crosslinking layer on the SOC layer;
crosslinking annealing;
depositing a resin layer on the SiARC layer;
forming a resin pattern;
transferring the resin pattern into the SiARC/SOC layers by etching so as to form the guide pattern.

This technique makes it possible to manufacture easily guide patterns at dimensions compatible with graphoepitaxy.

Advantageously, the base layer is deposited at a temperature below 300° C., and preferably below 250° C., in order that the deposition of the base layer does not damage the first functionalisation layer.

Advantageously, the base layer comprises carbon, in order that the guide pattern thereby formed is not modified by the later steps of the method.

Advantageously, the protective layer is a layer of a dielectric inorganic material comprising silicon, which makes it possible to be able to etch it selectively with respect to a carbon guide pattern. Such a layer further has the advantage of being able to be deposited at a temperature below 300° C., and preferably at 250° C., in order not to damage the first functionalisation layer during the deposition of the protective layer.

Advantageously, the protective layer has a thickness comprised between 5 and 15 nm and preferably between 5 and 10 nm, in order to protect the first functionalisation layer and to be able to be modified locally in order that the locally modified portion can be selectively etched.

According to different embodiments:
the ion implantation is carried out by exposure to a plasma, the implanted ions comprising hydrogen and/or helium. In this case, the implantation may be carried out in a dry etching reactor or in a plasma immersion reactor. This embodiment makes it possible to modify a portion of the protective layer so as to be able to etch it selectively with respect to the non-modified portion of the protective layer, without however that the modification method consumes by physical sputtering the modified portion of the protective layer;
the ion implantation may be carried out by exposure to an ion beam, the implanted ions comprising one of the following species: Ar, H, He, $N_2$.

According to a first embodiment, the selective etching may be a wet etching carried out using a hydrofluoric acid-based or phosphoric acid-based etching solution. Indeed, wet etching has the advantage of having a selectivity greater than 4 between the material exposed to the ion bombardment and the non-exposed material.

According to a second embodiment, the selective etching may be a dry etching carried out by means of a remote plasma, the etching step comprising the following sub-steps:
a first sub-step of forming a salt from a plasma;
a second sub-step of sublimation of the salt.

Dry etching is interesting when the protective layer is made of SiN because it is then possible to have very good selectivity between the exposed portion and the non-exposed portion.

Advantageously, the salt is formed from a fluorine and hydrogen-based plasma.

Advantageously, the salt is preferably sublimated by an annealing.

According to a third embodiment, the selective etching may be a vapour phase etching. Vapour etching has the advantage of having improved selectivity greater than 30 between the exposed portion of the protective layer and the non-exposed portion of the protective layer. However the salts formed on the surface require an additional cleaning step (with water or annealing) to remove these salts. This cleaning step does not consume the non-exposed portion of the protective layer.

According to different alternative embodiments:

the vapour phase etching may comprise a step of injecting hydrofluoric acid in vapour phase diluted in a solvent on the layers to be etched;

the vapour phase etching may comprise the following sub-steps:

injecting a gas of hydrofluoric acid into a reaction chamber in which are placed the layers to be etched;

injecting an inert gas into the reaction chamber.

Advantageously, the method may comprise a pre-annealing step before the vapour etching step, in order to remove humidity from the surface of the layers to be etched, which makes it possible to have better selectivity.

When the vapour etching forms non-volatile reaction products, the method may also further comprise a step of removing the non-volatile reaction products formed during vapour etching.

The step of removing the non-volatile reaction products may comprise:

a step of solubilising said products in an elimination solution, preferably water; and/or a step of annealing at a temperature comprised between 100° C. and 300° C.

Advantageously, the step of forming the second functionalisation layer comprises the following sub-steps:

depositing a layer of a second polymer so as to form a layer of the second polymer which completely covers the guide pattern. This deposition is preferably carried out by spin coating;

grafting the layer of the second polymer in the cavity, preferably by thermal annealing or photo-crosslinking;

rinsing using a solvent.

A second aspect of the invention relates to a graphoepitaxy method comprising a method for forming a functionalised guide pattern according to the first aspect of the invention and a step of depositing a block copolymer in the cavity.

Advantageously, the block copolymer comprises at least two monomer blocks and the first functionalisation layer having an equivalent affinity with all the monomer blocks.

Advantageously, the second functionalisation layer has a preferential affinity with one of the monomer blocks.

It is thus possible to produce, by means of the block copolymer, secondary patterns which have an orientation perpendicular to the substrate.

BRIEF DESCRIPTION OF THE FIGURES

Other characteristics and advantages of the invention will become clear on reading the detailed description that follows, with reference to appended FIGS. 1a to 1f, which illustrate the different steps of a method according to one embodiment of the invention.

For greater clarity, identical or similar elements are marked by identical reference signs in all of the figures.

DETAILED DESCRIPTION OF AT LEAST ONE EMBODIMENT

FIGS. 1a to 1f represent the steps of a method for manufacturing a guide pattern for graphoepitaxy according to one embodiment of the invention.

Figure 2:
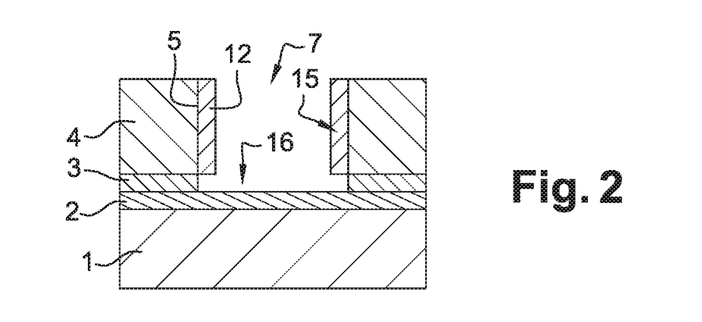
FIG. 2 schematically represents a functionalised guide pattern obtained by the method of FIGS. 1a to 1f.

With reference to FIG. 2, this method makes it possible to obtain a guide pattern 4 for graphoepitaxy comprising at least one cavity 7 of which the bottom 16 is functionalised so as to have a first affinity with the block copolymer that will be deposited in this cavity, whereas the side walls 15 are functionalised so as to have a second affinity with the copolymer that will be deposited in the cavity.

Figure 1A:
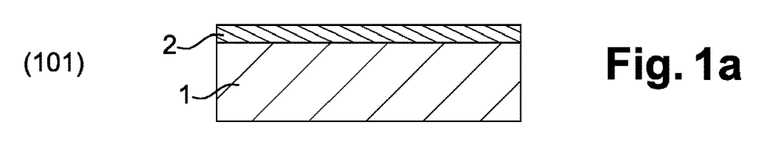

To do this, with reference to FIG. 1a, the method comprises a first step 101 of forming a first functionalisation layer 2 on the surface of the substrate 1. The first functionalisation layer 2 has a substantially constant thickness. The first functionalisation layer 2 has a thickness preferably comprised between 2 and 15 nm, and in a more preferential manner between 5 and 8 nm. The first functionalisation layer 2 is a layer of a first polymer. The composition of this first polymer is chosen as a function of the affinity that it is wished to obtain between the bottom 16 of the cavity 7 and the monomer blocks of the block copolymer that will be deposited in this cavity. The first polymer is also chosen as a function of the substrate. According to different embodiments, the first polymer may be a random copolymer, a homopolymer or any other type of graftable polymer being able to be used to control surface energies, such as for example a self-assembled monolayer (SAM). The first polymer could also be a crosslinkable polymer. According to a preferential embodiment, the first polymer may be chosen in such a way that the attraction forces between each of the monomer blocks of the block copolymer and the first functionalisation layer are equivalent. In this case, when the block copolymer that will be deposited in the cavity is PS-b-PMMA of cylindrical morphology, the first functionalisation layer could be a layer of PS-r-PMMA, comprising 70% by mass of polystyrene (PS) and 30% by mass of polymethyl methacrylate (PMMA). According to another embodiment, when the block copolymer that will be deposited in the cavity is PS-b-PMMA of lamellar morphology, the first functionalisation layer could be a layer of PS-r-PMMA, comprising 50% by mass of polystyrene (PS) and 50% by mass of polymethyl methacrylate (PMMA).

The step 101 of forming the first functionalisation layer 2 preferably comprises a sub-step of depositing a layer of the first polymer, for example by spin coating. The spin coating may be carried out by diluting the first polymer in an organic solvent. When the first polymer is PS-r-PMMA, the organic solvent may be propylene glycol methyl ether acetate (PGMEA). The solution of the first polymer diluted in the organic solvent may have a mass concentration of first polymer substantially equal to 1.5%. The step 101 of forming the first functionalisation layer 2 may next comprise a sub-step of fixing, also called grafting, the layer of the first polymer on the surface of the substrate. This grafting may be carried out by thermal annealing or photo-crosslinking. The thermal annealing is preferably carried out at a temperature substantially equal to 250° C., typically between 230° C. and 260° C., for a duration substantially equal to 10 minutes, typically between 5 and 15 minutes. The thermal annealing may be carried out on a hot plate or in a furnace. The step 101 of forming the first functionalisation layer 2 may next comprise a sub-step of rinsing during which the surplus of first polymer is removed using a solvent. When the first polymer is PS-r-PMMA, the solvent used may be propylene glycol methyl ether acetate (PGMEA). Another alternative of the step 101 would be to use a crosslinkable polymer. Thus, after the step of spreading by spin coating the polymer is crosslinked during a thermal annealing. This alternative could be used for cases where the first functionalisation layer 2 is not grafted on the substrate.

Figure 1B:
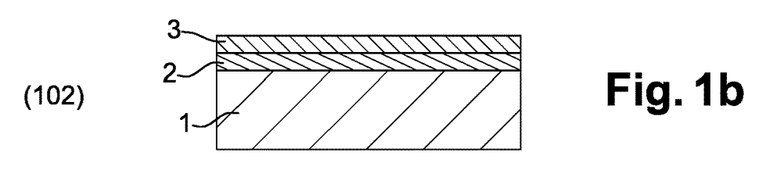

With reference to FIG. 1b, the method next comprises a step 102 of depositing a protective layer 3 on the first functionalisation layer 2. According to one embodiment, the protective layer 3 may be a dielectric inorganic layer comprising silicon which may be deposited at a temperature below 300° C., and preferably at a temperature below 250° C. in order not to damage the first functionalisation layer during its deposition. Thus, the protective layer may be a layer of one of the following materials: SiN, SiOC, $SiO_2$, SiCBN. The protective layer 3 could also be a layer of a silicon filled polymer, such as for example a silicon containing anti-reflective coating (SiARC), a layer of HSQ (ultra-dense hydrogen silsesquioxane) or instead a layer of poly(dimethylsiloxane) (PDMS). According to another embodiment, the protective layer may also be a layer of $HFO_2$ or TiN. The protective layer 3 preferably has a thickness comprised between 5 and 15 nm, and in a more preferential manner between 5 and 10 nm, so as to have a sufficient thickness to protect the first functionalisation layer during the later steps of the method, while being sufficiently thin to be able to be modified in such a way that a portion of this layer can be selectively etched as explained hereafter. The protective layer 3 preferably has a constant thickness. The protective layer 3 may be deposited by PVD (physical vapour deposition), ALD (atomic layer deposition), PEALD (plasma enhanced atomic layer deposition).

Figure 1C:
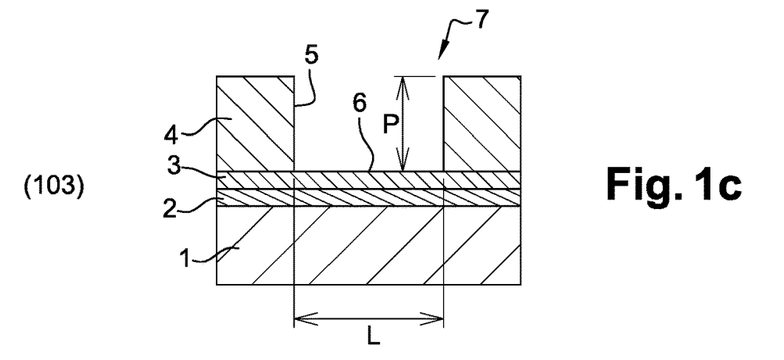

With reference to FIG. 1c, the method next comprises a step 103 of forming a guide pattern 4 on the surface of the protective layer 3. The guide pattern 4 comprises at least one cavity 7 which opens onto the protective layer 3. The cavity 7 thus comprises a bottom 6 formed by a portion 9 of the protective layer 3. The cavity 7 also comprises side walls 5 extending along a direction secant to the surface of the substrate. More specifically, the side walls 5 preferably extend along a direction perpendicular to the surface of the substrate. The cavity may have different geometries. It may thus take the shape of a cylindrical well, a trench, a well of rectangular section, an elliptical well or instead a Do shape or any other shape next enabling the graphoepitaxy method. The guide pattern 4 is preferably made of a material resistant to the etching techniques used during the later steps of the method, for example a material inert to hydrofluoric acid (HF) and/or to phosphoric acid ($H_3PO_4$). To this end, according to a first embodiment, the guide pattern may comprise carbon. Thus, the guide pattern may be made of carbon deposited by centrifugation (also called SOC for spin-on-carbon) or made of any other anti-reflective carbon layer. According to a second embodiment, which may be combined or not with the first, the guide pattern may be covered with a layer resistant to hydrofluoric acid (HF) and/or to phosphoric acid ($H_3PO_4$), such as for example a SiN layer. This SiN layer may be deposited by a conformal deposition technique. This second embodiment makes it possible to make the guide pattern of any type of material, such as for example silicon oxide, then to protect it by depositing above a layer resistant to the etching techniques used during the later steps of the method. Each cavity 7 preferably has a depth P comprised between 50 and 300 nm. Each cavity 7 preferably has a width L comprised between 30 and 200 nm. The step 103 of forming the guide pattern 4 may comprise the following sub-steps:

depositing one or more layers on the protective layer 3;
producing at least one cavity 7 through this or these layers, preferably by lithography, for example by photolithography.

The lithography is carried out in such a way that the cavity 7 opens onto the protective layer 3.

Figure 1D:
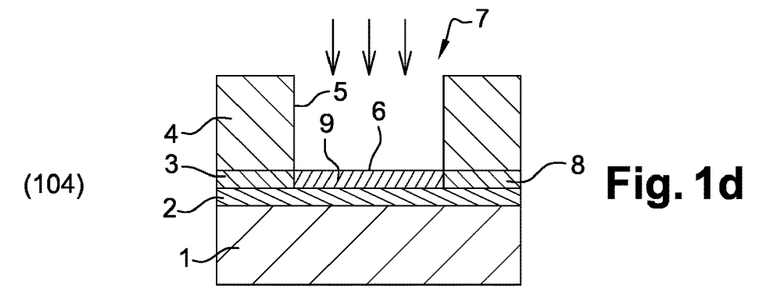

With reference to FIG. 1d, the method next comprises a step 104 of implanting light ions in the portion 9 of the protective layer that forms the bottom of the cavity 7 in such a way that it can be selectively etched with respect to the remainder of the protective layer 3. This implantation is carried out by exposing the portion 9 of the protective layer to a bombardment of so-called "light" ions, that is to say of which the atomic number is less than 10. At the end of this step, the portion 9 of the protective layer that has been exposed to the bombardment may thus be selectively etched with respect to the portion 8 of the protective layer that has not been exposed to the bombardment.

This ion bombardment may be carried out by means of a plasma or an ion beam.

Thus, according to a first embodiment, this implantation step 104 may be carried out in a dry etching or a plasma immersion reactor. The dry etching reactor may be for example a capacitively coupled plasma (CCP) reactor, or an inductively coupled plasma (ICP) reactor.

The implanted ions comprise hydrogen and/or helium. To do this, it is possible to use a plasma comprising a main gas, the main gas being a mixture of one or more of the following gases: He, $H_2$, $NH_3$, HBr, $C_xH_y$, $SiH_4$. The plasma may also comprise a dissociation gas, such as argon, helium, xenon, dinitrogen, making it possible to facilitate the dissociation of the main gas and, in this way, to favour the implantation of light ions in the protective layer.

The implantation conditions are chosen in such a way that the portion 9 of the protective layer which forms the bottom of the cavity 7 can be selectively etched with respect to the remainder of the protective layer 3. Thus, as an example, the table below gives typical conditions for implementing the step 104 of modifying the protective layer 3 in the case of use of a standard plasma etching reactor. These conditions are notably dependent on the nature of the protective layer 3, its thickness, and the plasma used.

| | |
|---|---|
| Flow rate of main gas | 10 $cm^3$/minute-100 $cm^3$/minute |
| Flow rate of dissociation gas | 10 $cm^3$/minute-500 $cm^3$/minute |
| Power of the source | 0-2000 W |
| Bias voltage | 20 V-500 V |
| Pressure | 5 milliTorr-100 milliTorr |
| Temperature | 10° C.-100° C. |
| Duration | 1 second-10 minutes |

The duration of exposure to the plasma notably depends on the thickness of the protective layer 3.

Figure 3:
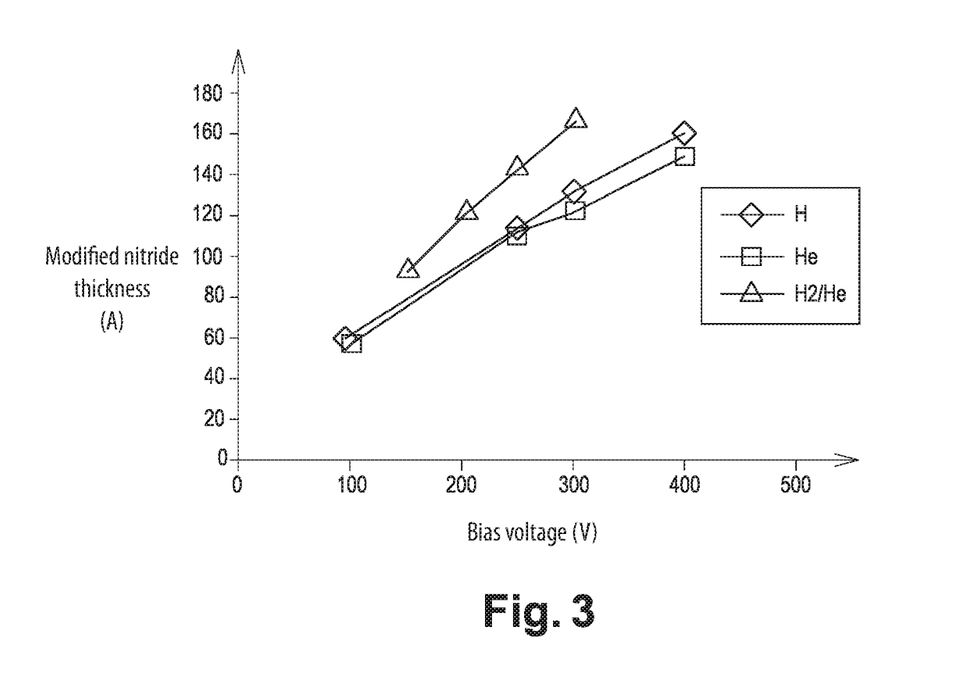
FIG. 3 represents the bias voltage to use for different thicknesses of a protective SiN layer when the plasma is hydrogen, helium, or a dihydrogen-helium mixture.

As an example, in the case where the protective layer is a SiN layer, FIG. 3 gives the bias power to use as a function of the thickness of the SiN layer and as a function of the plasma used, for three plasmas: a hydrogen-based plasma, a helium-based plasma and a dihydrogen and helium-based plasma.

Furthermore, it is also possible to pulse the bias voltage or the power of the source in order to better control the implantation depth. The pulsed parameter is preferably pulsed at a frequency comprised between 100 Hz and 500 Hz according to an operating cycle comprised between 10% and 90%. The fact of pulsing the bias voltage or the power of the source makes it possible to have less energetic ions, which is advantageous when the protective layer is thin, that is to say when the protective layer has a thickness below 10 nm.

According to a second embodiment, the implantation step 104 may be carried out in an ion beam implanter. It is then possible to implant light ions, that is to say of which the atomic number is less than 10, such as for example: Ar, H, He, $N_2$, etc.

The implantation conditions are also chosen in such a way that the portion 9 of the protective layer that forms the bottom of the cavity 7 can be selectively etched with respect to the remainder of the protective layer 3. These implantation conditions may be determined using software making it possible to simulate the profiles and depths of implanting a given species in a given material, for example SRIM (Stopping and Range of Ions in Matter) software based on a Monte-Carlo type simulation.

Figure 1E:
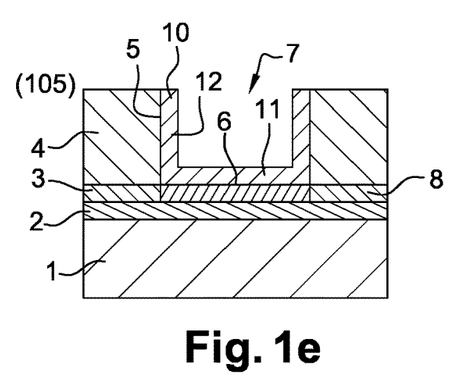

The method may also comprise a step 105 of forming a second functionalisation layer 10 in the cavity. The second functionalisation layer 10 comprises a first so-called "horizontal" portion 11 deposited on the bottom 6 of the cavity and a second so-called "vertical" portion 12 deposited on the side walls 5 of the cavity. The second functionalisation layer 10 has a substantially constant thickness. The second functionalisation layer 10 has a thickness preferably comprised between 2 and 15 nm, and in a more preferential manner between 5 and 12 nm. The second functionalisation layer 10 is a layer of a second polymer, different from the first polymer. The composition of this second polymer is chosen as a function of the desired interactions between the side walls of the cavity 7 and the block copolymer that will be deposited in this cavity. According to different embodiments, the second polymer may be a random copolymer, a homopolymer or any other type of graftable polymer being able to be used to control surface energies, such as for example a self-assembled monolayer (SAM). According to a preferential embodiment, the second polymer may be chosen so as to have a preferential interaction between one of the phases A or B of the block copolymer and the side walls 12 of the cavity. To this end, the second polymer could be a homopolymer of one of the phases of the block copolymer that will be deposited in the cavity. For example, when the block copolymer is PS-b-PMMA, the second functionalisation layer could for example be a layer of a homopolymer of PS or a homopolymer of PMMA. Generally speaking, if the block copolymer is an A-b-B type polymer, the second functionalisation layer 10 may be a homopolymer A or homopolymer B, as a function of what it is wished to produce as final device.

The step 105 of forming the second functionalisation layer 10 preferably comprises a sub-step of depositing a layer of the second polymer, for example by spin coating. The spin coating may be carried out by diluting the second polymer in an organic solvent. This organic solvent is preferably propylene glycol methyl ether acetate (PGMEA). This first sub-step of depositing is carried out in such a way that the thickness of the second polymer deposited is sufficiently important to completely cover the guide pattern. The solution concentration of the second polymer and the speed of deposition will thus be chosen as a function of the height of the guide pattern 4, in such a way that at the end of the step of depositing the second polymer, the layer of the second polymer completely covers the guide pattern 4.

For example, when the cavity 7 has a depth P of 150 nm, it is possible to use a solution of the second polymer having a mass concentration of the second polymer of 5%.

The step 105 of forming the second functionalisation layer 10 next preferably comprises preferably a sub-step of fixing, also called grafting, the layer of the second polymer on the guide pattern. This grafting may be carried out by thermal annealing or photo-crosslinking. The thermal annealing may be carried out on a hot plate or in a furnace.

The step 105 of forming the second functionalisation layer 10 may next comprise a sub-step of rinsing during which the surplus of the first polymer is removed using a solvent. When the second polymer is PS or PMMA, the solvent used may be propylene glycol methyl ether acetate (PGMEA).

Advantageously, the second polymer is grafted at lower temperature than the first polymer (typically between 150 and 170° C.) and/or for a shorter time (typically less than 3 or even 2 minutes) such that the density of grafted species is lower, leaving greater access to the underlying material.

Figure 1F:
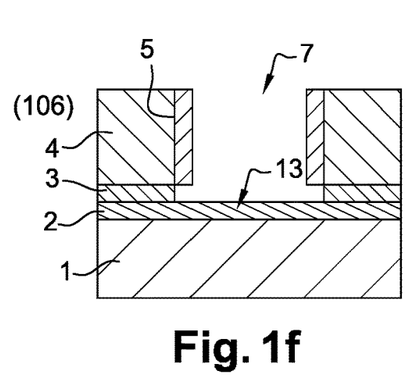

The method next comprises a step 106 of etching the portion 9 of the protective layer that has been modified, so as to expose the first functionalisation layer 2 at the bottom of the cavity. When a second functionalisation layer has been formed, the horizontal portion of the second functionalisation layer is also eliminated during this step by lift-off effect, the etching of the underlying protective layer leading to the elimination of the horizontal portion of the second functionalisation layer grafted on the protective layer. The substrate 1 and the guide pattern 4 are inert to this etching step. The portion of the protective layer 3 that has not been modified during the step 104 is not altered by this etching step, just like the vertical portion of the second functionalisation layer, on account of the selective character of the etching (i.e. the etching is specific to the implanted material of the protective layer).

The etching is carried out in such a way that, at the end of this step, the bottom of the cavity is formed by a portion 13 of the first functionalisation layer 2 (advantageously neutral with respect to the copolymer that it is wished to organise) whereas the walls of the cavity are covered with the vertical portion of the second functionalisation layer (preferably having a particular affinity with respect to one of the phases of the copolymer). To do this, different etching techniques may be used. The etching techniques chosen notably depend on the constitution of the protective layer.

Thus, according to a first embodiment, the etching may be a wet etching. When the protective layer 3 is a layer of SiOC, $SiO_2$, SiCBN, $HFO_2$, the wet etching may be carried out using a hydrofluoric acid-based etching solution. When the protective layer 3 is a SiN layer, the wet etching may be carried out using a hydrofluoric acid-based or phosphoric acid-based etching solution.

In the case of a hydrofluoric acid-based etching solution, the etching solution is preferably diluted to 1%. The duration of exposure of the layers to be etched to the etching solution depends on the thickness of the layers to be etched and on the concentration of the etching solution. It generally varies between 1 second and 10 minutes.

For example, in the case where the protective layer is a SiN layer of 10 nm, the duration of exposure is of the order of 30 seconds, both for a hydrofluoric acid-based or a phosphoric acid-based etching solution.

When the protective layer is a TiN layer, the exposed portion of the protective layer may be etched by an alkaline solution (SC1).

According to a second embodiment, the etching may be a dry etching. To this end a remote plasma is used. The etching step then preferably comprises two sub-steps:
  a first sub-step of forming a salt from a plasma;
  a second sub-step of sublimation of the salt.

The salt is preferably formed from a fluorine and hydrogen-based plasma. To this end nitrogen trifluoride may be used on the one hand and dihydrogen or ammonia on the other hand. The salt may be formed by placing the plasma for a duration comprised between 1 and 5 seconds at 2 Torr, at a temperature below 100° C.

The salt is preferably sublimated by an annealing. The annealing is preferably carried out at a temperature above 100° C. and preferably comprised between 150° C. and 200° C.

For example, when the protective layer is a SiN layer of 10 nm thickness, the dry etching may comprise the following sub-steps:
- a sub-step of forming a salt by means of plasma carried out with a flow rate of $NH_3$ comprised between 50 and 300 $cm^3$/minutes, at 30° C. for 45 seconds;
- a step of sublimation of the salt by means of an annealing at 180° C. for one minute.

According to a third embodiment, the etching may be carried out in vapour phase.

To do this, according to a first alternative embodiment, it is possible to use hydrofluoric acid in vapour phase diluted in a solvent. This approach enables a better selectivity with respect to the non-exposed portion of the protective layer. A cleaning step is then necessary to remove the salts formed after the etching step.

According to a second alternative embodiment, a gas of hydrofluoric acid may be injected into a reaction chamber in which are placed the layers to be etched. An inert gas is simultaneously injected into the reaction chamber. This inert gas makes it possible to adjust the ratio of hydrofluoric acid injected into the reaction chamber, and thus the etching speed. The ratio of hydrofluoric acid injected into the reaction chamber is preferably comprised between 10% and 90%. The flow rates of each of the two gases may be controlled independently. This etching may be carried out at ambient pressure and temperature or at a pressure below ambient pressure and at a temperature above ambient temperature. According to a preferential embodiment, the temperature is comprised between 15° C. and 80° C. and the pressure is comprised between 40 Torr and 760 Torr. The etching duration depends on the thickness to be etched. It is preferably comprised between 1 second and 10 minutes.

As an example, when the protective layer is a SiN layer of 10 nm thickness, the vapour etching may be carried out by injecting 31% of gas of hydrofluoric acid and 69% of dinitrogen, at ambient pressure and temperature, for two minutes.

Optionally a pre-annealing may be carried out before the vapour etching to eliminate any humidity from the substrate. This pre-annealing is preferably carried out at a temperature above 100° C. The duration between the pre-annealing and the vapour etching is preferably less than one hour in order to limit uptake of water. To this end, the pre-annealing and the vapour etching are preferably carried out in the same apparatus.

Furthermore, following the vapour etching, preferably a post-treatment is carried out making it possible to remove all the non-volatile reaction products that have been created during vapour etching.

To do this, according to a first alternative embodiment, the reaction products may be eliminated by solubilising them. To this end, it is possible to rinse the substrate using water, preferably de-ionised, for example for 10 minutes. The water can circulate or be vaporised on the substrate.

According to a second alternative, the reaction products may be eliminated by volatilising them. To do this, an annealing at low pressure can be carried out. As an example, this annealing may be carried out at a temperature of 200° C., a pressure of 1.5 Torr, by injecting a gas comprising dinitrogen and 4% of dihydrogen with a flow rate of 2000 $cm^3$/minute, for 180 seconds.

The method thus makes it possible to manufacture a guide pattern provided with a cavity of which the bottom is functionalised with a first functionalisation layer whereas the side walls are functionalised with a second functionalisation layer.

The guide pattern may next be used in a graphoepitaxy method, and notably in a method for directed self-assembly (DSA) of block copolymers in order to generate patterns of very high resolution and density.

The graphoepitaxy method may then comprise a step of depositing a block copolymer in the cavity of the guide pattern.

This block copolymer could notably be one of the following:
- PS-b-PMMA: polystyrene-block-polymethyl methacrylate,
- PS-b-PLA: polystyrene-block-polylactic acid,
- PS-b-PEO: polystyrene-block-polyethylene oxide,
- PS-b-PDMS: polystyrene-block-polydimethylsiloxane,
- PS-b-PMMA-b-PEO: polystyrene-block-polymethyl methacrylate-block-polyethylene oxide,
- PS-b-P2VP: polystyrene-block-poly(2vinylpyridine).

The block copolymer does not have the same affinities with the first functionalisation layer and with the second functionalisation layer such that the presence of these functionalisation layers makes it possible to control the orientation of the secondary pattern produced by means of the block copolymer in the cavity.

Of course, the invention is not limited to the embodiments described with reference to the figures and alternatives could be envisaged without going beyond the scope of the invention. The functionalisation layers could thus have other compositions than those described previously. Similarly, other block copolymers could be used. The invention is not limited either to the solvents given as an example in the detailed description. Furthermore, the invention has been described in the case where the guide pattern comprises a single cavity. However, it is applicable whatever the number of cavities in the guide pattern.

Moreover, the invention has been described in the case where the method comprises a step of forming a second functionalisation layer. However, this step is not obligatory. Furthermore, the invention has been described in the case where the step 105 of forming the second functionalisation layer is carried out after the ion implantation step 104. However, the order of these steps could be reversed. Thus, the ion implantation could also take place in the horizontal portion of the second functionalisation layer without this having an incidence on the remainder of the method, and notably on the selective etching step.

The invention claimed is:

1. A method for forming a functionalised guide pattern intended for the self-assembly of a block copolymer by graphoepitaxy, the forming method comprising:
   forming on a substrate a first functionalisation layer made of a first material having a first chemical affinity with respect to the block copolymer;
   depositing a protective layer on the first functionalisation layer;
   forming a guide pattern on the protective layer, the guide pattern comprising at least one cavity opening onto the protective layer, the cavity comprising a bottom and side walls;
   implanting ions having an atomic number less than 10 in a portion of the protective layer located at the bottom of the cavity by exposure to an ion bombardment, in such a way that the implanted portion of the protective layer can be selectively etched with respect to the non-implanted portion of the protective layer;

forming, in the cavity, a second functionalisation layer made of a second material having a second chemical affinity with respect to the block copolymer, the second functionalisation layer comprising a first portion arranged on the protective layer at the bottom of the cavity and a second portion arranged on the side walls of the cavity; and etching the implanted portion of the protective layer and the first portion of the second functionalisation layer selectively with respect to the non-implanted portion of the protective layer, the second portion of the second functionalisation layer and the first functionalisation layer, so as to expose a portion of the first functionalisation layer located at the bottom of the cavity.

2. The method according to claim 1, wherein the forming of the guide pattern comprises the following sub-steps:

depositing at least one base layer on the protective layer;
etching the base layer by lithography.

3. The method according to claim 2, wherein the base layer is deposited at a temperature below 300° C.

4. The method according to claim 2, wherein the base layer comprises carbon.

5. The method according to claim 1, wherein the protective layer is a layer of a dielectric inorganic material comprising silicon.

6. The method according to claim 1, wherein the ion implantation is carried out by exposure to a plasma, the implanted ions comprising hydrogen and/or helium.

7. The method according to claim 1, wherein the ion implantation is carried out by exposure to an ion beam, the implanted ions comprising one of the following species: Ar, H, He, $N_2$.

8. The method according to claim 1, wherein the selective etching is a wet etching carried out using a hydrofluoric acid-based or phosphoric acid-based etching solution.

9. The method according to claim 1, wherein the selective etching is a dry etching carried out using a remote plasma, the etching comprising the following sub-steps:

a first sub-step of forming a salt from a plasma;
a second sub-step of sublimation of the salt.

10. The method according to claim 9, wherein the salt is formed from a fluorine and hydrogen-based plasma.

11. The method according to claim 9, wherein the salt is sublimated by an annealing.

12. The method according to claim 1, wherein the selective etching is a vapour phase etching.

13. The method according to claim 12, wherein the vapour phase etching comprises injecting hydrofluoric acid in vapour phase diluted in a solvent on the layers to be etched.

14. The method according to claim 12, wherein the vapour phase etching comprises the following sub-steps:

injecting a gas of hydrofluoric acid into a reaction chamber in which are placed the layers to be etched;
injecting an inert gas into the reaction chamber.

15. The method according to claim 12, further comprising a pre-annealing step before the vapour phase etching.

16. The method according to claim 12, wherein the vapour phase etching forms non-volatile reaction products, the method further comprising removing the non-volatile reaction products formed during the vapour phase etching, the removing of the non-volatile reaction products comprising:

solubilising said products in an elimination solution; and/or
annealing at a temperature comprised between 100° C. and 300° C.

17. A graphoepitaxy method comprising a method for forming a functionalised guide pattern according to claim 1 and a step of depositing a block copolymer in the cavity.

18. The graphoepitaxy method according to claim 17, wherein the block copolymer comprises at least two monomer blocks, the first functionalisation layer having an equivalent affinity with all the monomer blocks, the second functionalisation layer having a preferential affinity with one of the monomer blocks.

19. The method according to claim 3, wherein the base layer is deposited at a temperature below 250° C.

20. The method according to claim 16, wherein the elimination solution is water.

* * * * *